United States Patent
Maan et al.

(10) Patent No.: US 8,660,832 B2
(45) Date of Patent: Feb. 25, 2014

(54) METHOD FOR CONFIGURING A TEST ARRANGEMENT, TEST METHOD AND TEST ARRANGEMENT

(75) Inventors: Al-Homci Maan, Hamburg (DE); Klemens Brumm, Wedel (DE); Jan Bobolecki, Borstel-Hohenraden (DE); Rainer Casdorff, Hamburg (DE); Josef Kruse, Hamburg (DE); Dirk Martinen, Jork (DE)

(73) Assignee: Airbus Deutschland GmbH, Hamburg (DE)

( * ) Notice: Subject to any disclaimer, the term of this patent is extended or adjusted under 35 U.S.C. 154(b) by 871 days.

(21) Appl. No.: 12/435,013

(22) Filed: May 4, 2009

(65) Prior Publication Data
US 2009/0276201 A1 Nov. 5, 2009

Related U.S. Application Data

(60) Provisional application No. 61/050,295, filed on May 5, 2008.

(30) Foreign Application Priority Data

May 5, 2008 (DE) .......................... 10 2008 022 132

(51) Int. Cl.
G06F 17/50 (2006.01)
G06G 7/62 (2006.01)

(52) U.S. Cl.
USPC .............................................. 703/13; 703/14

(58) Field of Classification Search
USPC ..................................................... 703/13, 14
See application file for complete search history.

(56) References Cited

U.S. PATENT DOCUMENTS

| | | | |
|---|---|---|---|
| 5,745,738 A * | 4/1998 | Ricard .............................. | 703/13 |
| 5,923,567 A | 7/1999 | Simunic et al. | |
| 7,360,158 B1 * | 4/2008 | Beeman ......................... | 715/705 |
| 7,424,418 B1 * | 9/2008 | Soufi et al. ....................... | 703/14 |
| 2002/0073375 A1 | 6/2002 | Hollander | |
| 2004/0225459 A1 | 11/2004 | Krishnaswamy et al. | |

FOREIGN PATENT DOCUMENTS

WO 8608298 9/1986

OTHER PUBLICATIONS

Einwich, K., Krampl, G., Hoppenstock, R., Koutsandreas, P., Sattler, S., & Munich, S. (1999). A multi-level modeling approach rendering virtual test engineering (VTE) economically viable for highly complex telecom circuits. In Proceedings user forum Date (pp. 227-231).*

Jan Riegel, et al, University Kaiserslautern, Kaiserslautern, "Objektorientierte Modellierung einer Simulationsumgebung mit Patterns;" Sep. 1996.

(Continued)

Primary Examiner — Aniss Chad
(74) Attorney, Agent, or Firm — Wood, Herron & Evans, LLP

(57) ABSTRACT

The invention relates to a method for configuring a test arrangement for a device to be tested, which is one component of a system containing, several components. The components of the system are described by data records, which have elements that describe relationships of components with one another. The method includes linking the data records to generate a system description based on the linked data records, simulating of the system by a simulation based on the system description, wherein an image of the device to be tested is in the simulation. The method also includes removal of the image of the device from the simulation and provision of one or more test interfaces in hardware for communication between the simulation facility and the device.

17 Claims, 3 Drawing Sheets

(56) References Cited

OTHER PUBLICATIONS

Wikipedia Article: Design for Test; http://en.wikipedia.org/wiki/Design_For_Test; last modified Jul. 8, 2010.
Wikipedia Article: Automatic Test Pattern Generation; http://en.wikipedia.org/wiki/Automatic_test_pattern_generation; last modified Jul. 8, 2010.
Wikipedia Article: Integrated circuit design; http://en.wikipedia.org/wiki/Integrated_circuit_design; last modified Aug. 29, 2009.
Wikipedia Article: SPICE (Simulation Program with Integrated Circuit Emphasis); http://en.wikipedia.org/wiki/SPICE; last modified Nov. 17, 2009.
Wikipedia Article: Logic simulation; http://en.wikipedia.org/wiki/Logic_simulationlast modified Aug. 26, 2009.
Wikipedia Article: Design for Test; http://en.wikipedia.org/wiki/Design_/For_Test; last modified Oct. 23, 2009.
Wikipedia Article: Computersimulation; http:/de.wikipedia.org/wiki/Computersimulation; (http://www.asim-gi.org/); last modified Nov. 13, 2009.
Schwope, A; ASIC-Test mit DFT (Design for Test); http://en.wikipedia.org/wiki/Integrated_circuit_design; last modified Aug. 29, 2009.

* cited by examiner

METHOD FOR CONFIGURING A TEST ARRANGEMENT, TEST METHOD AND TEST ARRANGEMENT

This application claims priority to U.S. Provisional Patent Application No. 61/050,295, filed on May 5, 2008; and/or German Patent Application No. 102008022132.52, filed on May 5, 2008.

TECHNICAL FIELD

The present invention relates to a method for configuring test arrangements, as well as a test method and test arrangements.

BACKGROUND TO THE INVENTION

Nowadays increasingly complex systems with digital components are being developed and used in many fields of technology. This relates inter alia to the field of aviation, computer technology, vehicle technology and communications technology.

The increasing complexity of these systems is based partly on the growing number of components used, but is partly caused also by the increasing complexity of the individual components themselves, for example due to the steady increase in circuit density on semiconductor elements.

Before such systems are ready for use, they must be tested for the correct functionality. A high level of complexity of such systems to be tested makes testing complicated and laborious, however. In particular, if a plurality of components are connected to one another, reliable testing is extraordinarily complex and timer consuming. If a system is still under development and is subject to regular adjustments and changes, constantly changing requirements result for the test method. It is then not normally possible to perform automatic testing of a system under development. In general, manual test operation is necessary instead, and a test engineer must intervene at many points directly in the test development, configuration and execution.

In the prior art, the normal procedure is such that a system, for example an integrated circuit, is reproduced by simulation. The integrated circuit is activated by signals and its response behaviour is registered and compared with the behaviour of the simulation, in order to detect any faults in the circuit. To be able to execute such a method, it is necessary for the data for the simulation to describe the ideal state of the device to be tested fully and correctly. A fault in the simulation makes a correct test procedure impossible and can even lead to dangerously incorrect test results.

Methods of this kind are dealt with in the specifications US 2002/0073375 A1 and US 2004/0225459, for example.

Mostly already fully developed components are tested for correct functioning as part of the quality control process during manufacture using such methods of the prior art. These methods are not designed, however, for testing whether an overall system under development, for example, can be operated within certain preset system parameters, thus can meet certain system requirements, when using a certain device to be tested. To do this, elaborate tests of larger system parts or even the overall system are required.

A further problem associated with this in the prior art consists in the device to be tested not being tested in the environment in which it is used. The signals for testing transmitted to the device to be tested are independent of the future system environment. The system environment itself is not reproduced, so that a very incomplete environment for the device to be tested results and a dynamic environment such as can arise during use is not incorporated into the test. Changes in the system environment also lead to the signals to be transmitted to the device to be tested having to be adapted manually.

A requirement exists accordingly for a method and a system for testing components of a system, which method and system can be adapted easily to changes in the device to be tested and/or its system environment and which also solve the other problems addressed. To this end it is first necessary to configure a test arrangement prior to the actual testing.

SUMMARY OF THE INVENTION

To achieve the aforementioned objects, the present invention proposes a method for configuring a test arrangement for a device to be tested, which is envisaged as a component of a system containing several components, wherein the components of the system are described by data records, which have elements that describe relationships of components with one another. The method comprises the steps of linking the data records and producing a system description based on the linked data records, simulating the system by means of a simulation by means of a simulation facility based on the system description, wherein an image of the device to be tested is registered in the simulation, removing the image of the device to be tested from the simulation and providing one or more test interfaces for communication between the simulation facility and the device to be tested.

According to the invention a test system is thus configured that provides a simulation of a system environment of the device to be tested and not only the signals produced by an environment via the one or more test interfaces. The simulation contains a virtual image of the device to be tested as well as virtual images of the other components that are defined as belonging to the system. Furthermore, the relationships of the components with one another are reproduced, which can describe the communication options between the components, for example. The virtual image of the device to be tested is separated from this simulation. It should be heeded in this regard that only the image of this device is removed from the simulation, but the connections and relationships of the components are retained. A type of gap, therefore, to which connections continue to run, arises in the simulation. A virtual system environment is thus created for the device to be tested, which can be connected via the test interfaces and any further suitable measures (such as further software interfaces, for example) to the connections that are open following the removal of the image of the component to be tested. The connections to the image of the component to be tested are capped, therefore, in such a way that this image can be removed virtually and replaced by the actual unit to be tested. A comprehensive test of the device to be tested can thus be undertaken. Furthermore, the configuration of the test arrangement takes account of changes in components of the system, in that these are integrated into the system description and subsequently into the simulation. This automatically includes changes in the device to be tested. Due to this method, a greater focus is placed on the system environment instead of just on the device to be tested compared with the prior art. The test arrangement can be configured partly in software, on the other hand hardware is necessary in any case to provide one or more test interfaces at the test arrangement for communication with the device to be tested. Linking of the data records takes place in accordance with the elements of the data records describing the relationships of the components with one another.

In a preferred embodiment it is provided that data records also have elements describing further attributes of a component. Due to this, even attributes that are not directly assigned to relationships of the components with one another, such as states of a component, required resources and the like, can be included in the system description.

On linkage, the elements of the data records describing relationships of the components are preferably checked for consistency. It can thereby be established whether the relationships of the components with one another are described consistently by the data records, whether a consistent system of relationships results, therefore. It is advantageous that if an inconsistency is detected, information relating to this is supplied. This represents valuable development data and can then be forwarded to developers, for example, who adapt the data records and the related components accordingly. The data records as a whole can also be checked for consistency, so that the further attributes of the components are also registered.

In a preferred embodiment, the step of linking the data records and producing the system description is executed without taking into account elements of the data records that describe relationships of the components and are not consistent. These are left out, therefore, so that a consistent system description always results with reference to the relationships of the components with one another. Undefined states are thereby avoided in the simulation and fault sources eliminated. At the same time, this leads to a simulation of the system that comes very close to the performance of the system simulated, as this is only reasonably functional within its consistently specified area. Alternatively, the step of linking the data records and producing the system description is executed without taking account of elements of the data records that are not consistent. An even better simulation of the actual performance of the system is thereby achieved, since further component attributes are also taken into consideration.

The data records advantageously describe signals exchangeable between components. The relationships between the components can thus be represented abstractly.

It can be provided that it is established on checking whether signals, which according to a data record assigned to a first component can be received by the first component from a second component, tally with signals, which according to a data record assigned to the second component can be sent by this to the first component. Normally the relationships between individual components are defined namely by the signals that they exchange with one another. A consistency check of relationships of the components with one another defined in such a way can be carried out simply in the manner proposed.

In an advantageous development of the invention, it is provided that the test arrangement is connected to a database, which contains the data records. In this way the data records can be stored and managed conveniently. This also permits the data to be maintained independently of the test arrangement.

It is desirable to execute a step of generating a driver for the device to be tested on the basis of the data records, according to which the device to be tested is activated via the one or more interfaces. In a modern digital system environment, individual components must be addressed according to certain prescribed rules to function in a defined way. To achieve this, a driver for the device to be tested can be generated from the data records describing the components, and in the event of a change in the description of the device to be tested, this driver is automatically adapted to the changes.

The invention also relates to a test method, which furthermore provides the steps of connecting the device to be tested to the simulation facility via the one or more test interfaces and of testing the device to be tested by sending signals to the device to be tested and receiving response signals via the one or more test interfaces.

It is advantageous if complete documentation takes place in each step executed, in which documentation the data occurring and exchanged are written out and saved. In particular, it is desirable to log all data occurring in the simulation.

Furthermore, the present invention relates to a test arrangement for testing a device to be tested, wherein the device to be tested is provided as a component of a system, wherein the components of the system are described by data records with elements for describing relationships of components with one another. The test arrangement comprises a system description facility for linking the data records and for producing a system description based on the linked data records, a simulation facility for simulating the system based on the system description, wherein the device to be tested is registered by an image in the simulation and it is provided that the image of the device to be tested is removable from the simulation, and one or more test interfaces for facilitating communication between the simulation facility and the device to be tested.

Furthermore, further arrangements and configurations can be provided to execute the steps listed above.

DESCRIPTION OF FIGURES

In the context of the description, the term component refers to a part of a higher-level system in which the device to be tested is to be used. A component of this system can be software or hardware in this case, but as a rule it will have both software and hardware portions. The device to be tested always has a hardware portion and is part of the system.

Figure 1:
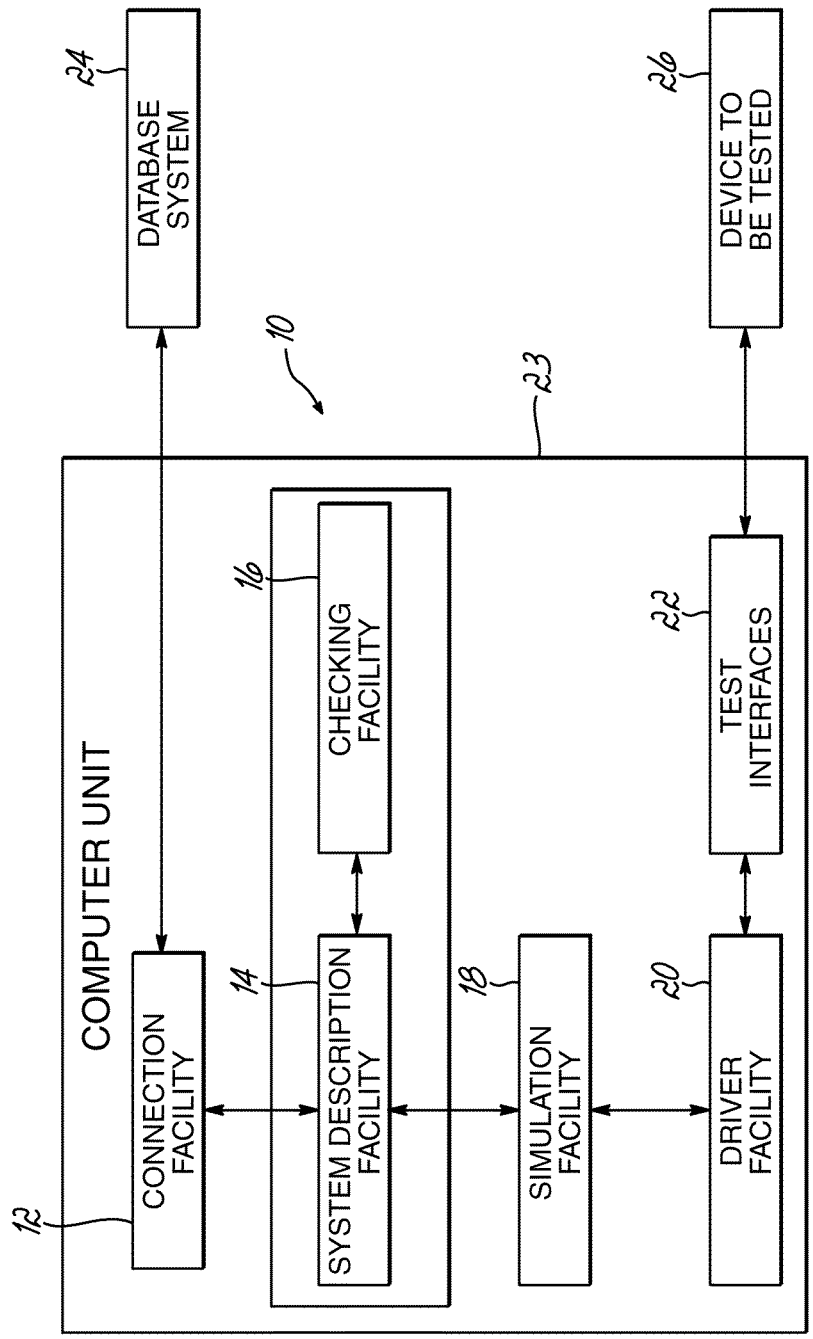
FIG. 1 shows schematically a layout of a test arrangement according to the invention and facilities connectable thereto.

In FIG. 1, an example test arrangement 10 is shown, which has a connection facility 12. As well as the connection facility 12, the test arrangement 10 comprises a system description facility 14, which is connected to a checking facility 16 for transporting data. The checking unit 16 and the system description facility 14 can also be formed as a common facility. Furthermore, the system description facility 14 is connected on the one hand to the connection facility 12 and on the other hand to a simulation facility 18. One or more interfaces 22 are provided for data exchange with the simulation facility and connected to a driver facility 20. Suitable connections for data exchange exist between the facilities 12, 14, 16, 18, 20 and the test interfaces 22.

The various facilities of the test arrangement 10 can be formed separately or implemented in a computer unit 23. It can also be advantageous to implement some of the units on a computer unit 23 and to distribute the others either each separately or in some cases together to other computer units (not shown). Each of the facilities 12, 16, 14, 18, mentioned can be implemented as a program, which runs for example on the memory of at least one computer unit 23 belonging to the test arrangement 10. The driver facility 20 in particular is advantageously executed as software.

The connection facility 12 of the test arrangement 10 is connected in a known manner by a connection not described in further detail to a database system 24, for example via a TCP/IP connection. The data records are transmitted as required to the test arrangement 10 via this connection. The database 24 can naturally also be formed integrated with the test arrangement 10.

The database system 24 stores the data records, which describe the relationships of components with one another and preferably also attributes of the individual components. The data records can contain specifications for components, for example, such as are used in aviation. In particular, those signals that a component should be able to send to other components and receive from these are advantageously stored in the data records. The data records preferably contain respectively the signal configuration (e.g. the manner in which and when certain signals are used), signal input/output descriptions (e.g. relating to the respective type of connection with other components), and details of the signals themselves; this combination of information is described below as signal protocol. Signal protocols can overlap in this case with reference to different components, if for example data can be sent via the same connection (interface) to various components.

A data record can also contain data about the mode of functioning, operating conditions (for example power consumption, resources), emergency attributes, states of the component and similar as attribute information. Depending on the complexity of the system, very many data records can be contained in the database, each with a plurality of elements that describe a component. It is advantageous to create a single data record for each component, in order to have only a small outlay on data maintenance in the event of a change to a component. In the development of large systems it is advisable to undertake the creation and management of data records (which specify the components) separately from the test arrangement 10, in order to guarantee the greatest possible flexibility and independence of the developers.

The test arrangement 10 can be connected via the one or more test interfaces 22 to a device 26 to be tested, which is part of a system to be formed from the components described by the data records.

From the data records contained in the database system 24, the system description unit 14 produces a description of the system of which the component to be tested is defined as a part, based on the information contained in the data records regarding the relationships of the components described with one another and the described attributes of the components. To this end the system description facility 14 can link the data records on the basis of the elements describing relationships of the components.

The checking facility 16 is provided to check whether the relationships are described consistently. In particular, it is provided in this example that the checking facility 16 establishes whether the details for the signal exchange between various components are consistent. This can comprise a check, for example, of whether one component expects a definite response signal B from another component to a certain signal A, but according to its data record the latter is supposed to transmit a completely different signal C, or whether a component can emit a signal A at all that another component is supposed to be able to receive from it. The checking unit 16 also checks whether each data record is consistent in itself, for example whether contradictory details of functions or attributes are present. In addition, it is checked whether certain required information is present in the data records, or any undefined elements of the data records are present. If the checking facility 16 detects a contradiction or a loophole in the definition, it issues a warning. This can be stored and made available to the developers, for example, so that they can complete their development work. The checking facility 16 thus checks the specifications of the components that are stored in the data records and advises of faults occurring. In this example, the defective information in the data records is filtered out at this stage. It is also possible, however, to mark the defective information so that it can be left out later. Alternatively, references to the defective information can also be stored. In this case defective information is handled in the smallest possible information units, i.e. in particular, when a fault occurs, it is not the entire data record that is treated as defective, but only the elements of the data record that are actually defective.

The system description facility 14 produces a system description, which not only contains the relationships of the components with one another but also the remaining elements of the data records, if present. The defective information is not included in the system description. In one variant this can be due to the fact that it has already been filtered out by the checking facility 16; alternatively it is filtered out on production of the system description, for example by using markings or references.

The simulation facility 18 produces from the system description a simulation of the system, which simulates the information exchange and the defined interactions of the components and also represents the behaviour of the individual components, The defective elements of the data records are not taken into account here, as they no longer appear in the system description. Alternatively, the possibility exists of designing the system description facility 14 not to filter out the defective information and to let the simulation facility 18 execute this task. Leaving the defective information out of the simulation is not necessary, however, for configuring the test arrangement. The simulation facility 18 simulates an entire system, therefore, of which the device to be tested is a part.

The simulation facility 18 is designed to remove the image of the component 26 to be tested from the simulation once the simulation is complete and to be suitable for communicating with a connected device 26 to be tested via the one or more test interfaces 22. Furthermore, the simulation facility 18 is able to observe the simulation and record its behaviour.

The system description facility 14 and the connection facility 12 can also be formed or implemented integrated with one another. Likewise, the system description facility 14 and the checking facility 16 can also be formed integrally. An integral combination of the three facilities 12, 14, 16 is also possible.

The driver facility 20 is provided in order to create, on the basis of the data records of the component to be tested and data records that are assigned to the components communicating with it, a driver for the device 26 to be tested, so that the simulation facility 18 can communicate with the device 26 to be tested via the one or more test interfaces 22. This is possible as the data records contain the signals and signal protocols to be exchanged. In this example, however, the driver is purged of any defective signals if the checking facility 16 should have found any. The driver facility 20 is connected to the system description facility 14. Alternatively, the driver facility 20 can also be connected to the checking facility 16. It is naturally also possible to have a predefined driver for the component 26 to be tested, which driver is provided for communication between the device 26 to be tested and the test arrangement 10 via the one or more test interfaces 22.

The facilities 12, 14, 16, 18, 20 are designed to document their behaviour, in particular to create and maintain complete log files during operation. Thus each individual step is traceable, which is a considerable advantage for a test arrangement in a safety-relevant field.

Figure 2:
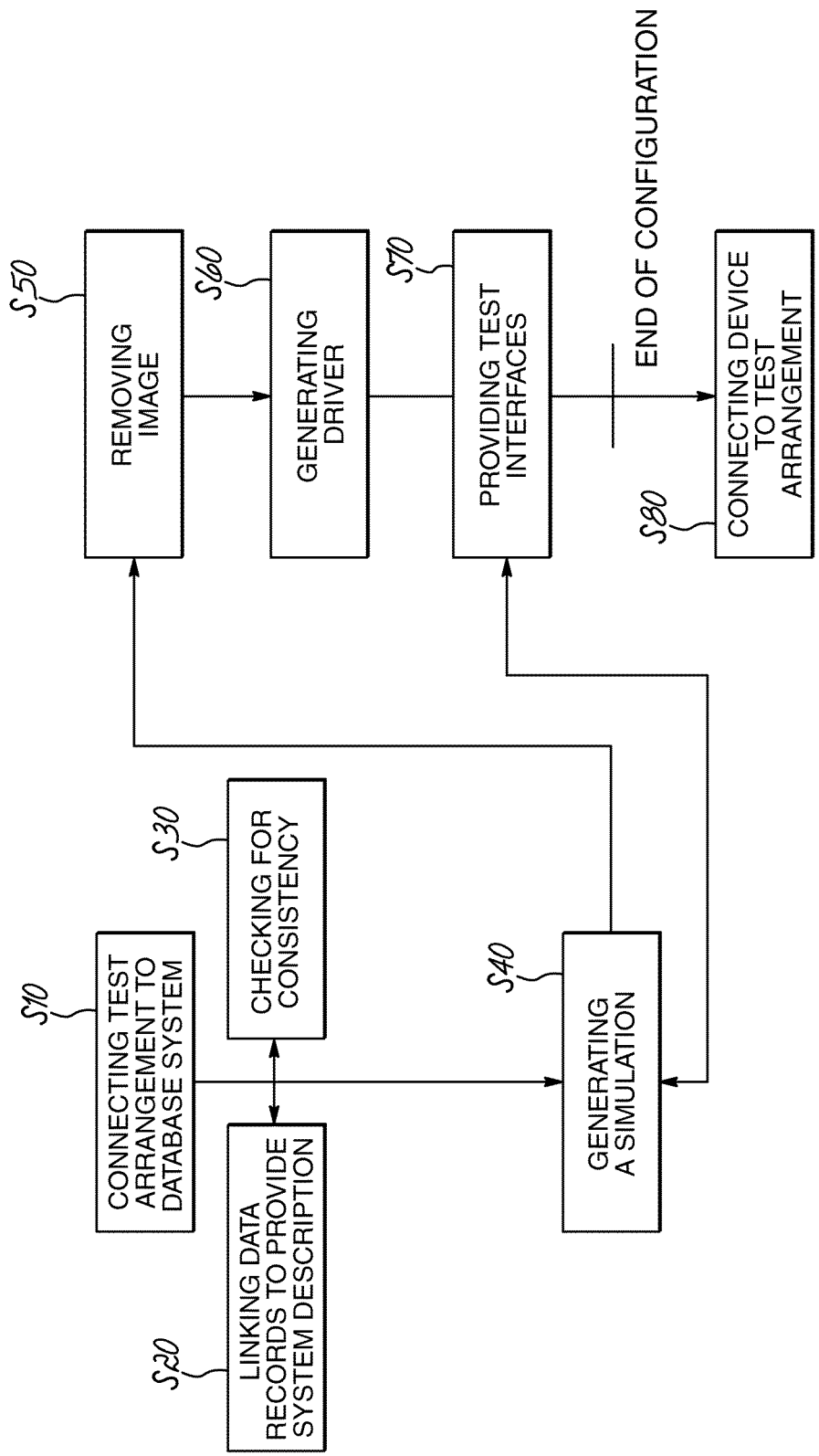
FIG. 2 shows schematically a method for configuring the test arrangement.

A method for configuring a test arrangement 10 is described below with reference to FIG. 2.

In a step S10, the test arrangement 10 is connected to a database system 24. The data records, which describe components belonging to the system, are transmitted from the database to the test arrangement 10. From the data records, a system description is produced in step S20 of the elements of the data records that describe the relationships of the components with one another. During step S20, a check for consistency is executed in a step S30 of the elements of the data records that describe relationships of the components with one another. The steps S20 and S30 are executed parallel to one another, so that the consistency check takes place during production of the system description, Documentation of the faults detected in specification of the components can also be undertaken in step S30.

A step S40 is also provided, in which a simulation of the overall system described by the data records is generated from the system description produced in steps S20 and S30, wherein defective elements of the data records are not taken into account. The check carried out in the example shown in FIG. 2 is not necessary, however, to attain a test configuration. Due to the check in step S30, a simulation of the system in which the device to be tested is to be used results that is consistent in itself. An image of the device to be tested is contained in the simulation.

In a step S50, the image of the device to be tested is removed from the simulation. The simulation is continued without the image.

For a step S60, it is provided to generate a driver for the device to be tested from the system description of step S20 or steps S20 and S30. This step is not absolutely necessary; a prepared driver can be used instead, or a driver can be dispensed with completely if it should not be necessary.

In step S70, one or more test interfaces 22 are provided, via which communication becomes possible between the simulated system, which is kept continuously ready, and the device 26 to be tested through the medium of the driver.

The configuration of the test arrangement is thus complete.

As the expert will easily recognize, it is not necessary to execute the method in the order described. In particular, it is possible to put the steps S50 to S70 in any other order without adversely affecting the configuration of the test arrangement.

In a step S80, the component 26 to be tested can optionally be connected via the one or more test interfaces 22 to the test arrangement 10 and test operation carried out. To do this, signals are transmitted between the simulation and the device 26 to be tested. The device 26 to be tested is addressed by certain signals and its response is registered and stored. At the same time, the simulation is carried out and its behaviour in interaction with the device to be tested is studied.

Figure 3:
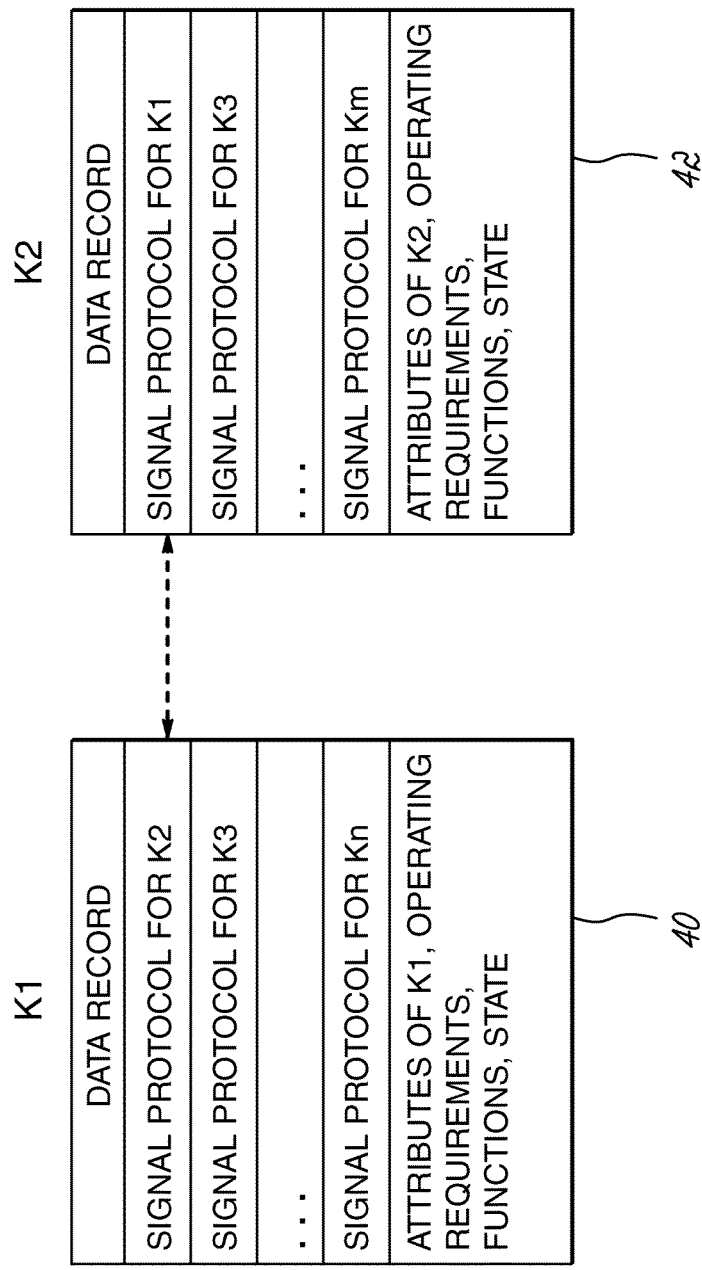
FIG. 3 shows schematically a possible structure of data records for describing the components of a system.

FIG. 3 shows schematically an exemplary structure of data records 40, 42, which describe a component K1 and a component K2. Each data record 40, 42 has signal protocols for a signal exchange with other components. It is not necessary for a component of the system to communicate with all other components. In the example shown in FIG. 3, it is provided that the component K1 communicates with the component K2, and can also communicate with arbitrary further components K3, . . . Kn. Component K2 in turn likewise communicates with component K3 in addition to component K1 and otherwise with arbitrary further components. The signal protocols determine the signals that can be sent and received at related components and the signal paths. Furthermore, a data record 40, 42 comprises component-specific data, which specify the attributes of the respective component. These data can by all means be connected to certain signal protocols. For example, it can be contained in a data record 40, 42 that a component changes its state if it has received a certain signal, for instance if a switch is to be operated on the basis of a transmitted signal.

The test arrangement is configured according to the invention such that a system environment such as occurs in actual use is simulated for the device to be tested. This facilitates an analysis of the component to be tested under conditions of use. Moreover, a plurality of components can be tested on the basis of a generated simulation by simply removing the corresponding image of the component to be tested from the simulation. Such a reconfiguration is easy to perform without having to generate a new overall simulation. In the event of changes to the system, because new components are added, for example, or certain components are replaced by components with other attributes, the invention leads to a simulation reliably matched to the system. Furthermore, a test arrangement is supplied by the invention that is configured in such a way that a device to be tested (and the related system) is tested not only for correct functionality, but also for the fulfilment of certain system requirements. To be precise, by providing a simulation, the behaviour of which is observed, it is easily possible to check behaviour parameters of the device to be tested and system parameters under conditions of use and to monitor the fulfilment of defined system requirements.

The methods described and the test arrangement are particularly suitable for use in is aircraft development, and here in particular in the development of the cabin system. Components used for aircraft development should be manufactured to precise specifications and must satisfy defined system requirements in the system. Exact specifications thus exist from the outset for the components, and the developers are forced to maintain these so that they are up to date, which makes them easy to use for the present invention. The stringent tests of the highly complex systems required in aircraft construction can be executed particularly favourably and easily according to the invention.

The invention claimed is:

1. A method for operating a test arrangement for a device to be tested having a hardware portion, wherein the device is one component of a system containing several components, wherein the components of the system are described by data records including elements that describe relationships of components with one another, wherein the data records describe signals exchangeable between the components, the method comprising:
providing at least one computer unit including a memory operable to implement:
linking the data records to generate a system description based on the linked data records, wherein at least one of the data records describes the device to be tested having the hardware portion;
simulating the system by a simulation generated by a simulation device based on the system description, wherein an image of the device to be tested is captured in the simulation, the image simulating actual signal generations and use of the device to be tested, and
removing the image of the device to be tested having the hardware portion from the simulation so that a gap arises in the simulation, which retains connections and relationships between the removed image of the device and the other components,
providing one or more test interfaces in hardware for physical connection and communication between the simulation device and the device to be tested having the hardware portion, according to the retained connections and relationships between the removed image of the device and the other components within the simulation so that the removed image of the device is replaced by the actual device to be tested, and wherein the computer unit is further operable to implement the step of:

generating, based on the data records, a driver for the device to be tested having a hardware portion to provide communication between the simulation device and the hardware portion of the device to be tested, according to which the device to be tested is activated via the one or more test interfaces.

2. The method according to claim 1, wherein the data records further include elements describing attributes of a component.

3. The method according to claim 2, wherein upon linking of the data records and/or generating the system description, the method further comprises:

checking the elements of the data records for consistency.

4. The method according to claim 3, wherein the step of linking the data records and generating the system description and/or the step of generating the simulation is executed without using elements of the data records that are not consistent.

5. The method according to claim 1, wherein upon linking of the data records and/or generating the system description, the method further comprises:

checking the elements of the data records describing relationships of the components for consistency.

6. The method according to claim 5, wherein the step of linking the data records and generating the system description and/or the step of generating the simulation is executed without using elements of the data records that describe relationships of the components that are not consistent.

7. The method according to claim 5, wherein checking the elements of the data records further comprises:

establishing whether signals, which according to a data record assigned to a first component are adapted to be received by the first component from a second component, tally with signals, which according to a data record assigned to the second component are adapted to be sent by the second component to the first component.

8. The method according to claim 1, further comprising:

connecting the test arrangement to a database, which contains the data records, and retrieving the data records that are necessary to generate the system description.

9. A method for testing a device to be tested, comprising the steps according to claim 1, and further comprising:

connecting the device to be tested to the simulation device via the one or more test interfaces, and testing the device to be tested by sending signals to the device to be tested and receiving response signals by the simulation device via the one or more test interfaces.

10. A test arrangement for testing a device having a hardware portion, wherein the device to be tested is one component of a system containing several components, wherein the components of the system are described by data records including elements for describing relationships of components with one another, wherein the data records contain a description of signals exchangeable between the components, wherein the test arrangement comprises:

at least one computer unit having a memory operative to implement the following devices:

a system description device for linking the data records and generating a system description based on the linked data records, wherein at least one of the data records describes the device to be tested having the hardware portion, and a simulation device for simulating the system based on the system description, wherein the device to be tested is registered as an image in the simulation, the image simulating actual signal generations and use of the device to be tested, and the image of the device to be tested is adapted to be removed from the simulation so that a gap arises in the simulation, which retains connections and relationships between the removed image of the device and the other components, one or more test interfaces provided in hardware for enabling physical connection and communication between the simulation device and the device to be tested having the hardware portion according to the retained connections and relationships between the removed image of the device and the other components within the simulation so that the removed image of the device is replaced by the actual device to be tested, and wherein the at least one computer unit further includes a driver device, which is adapted to generate a driver for the device to be tested having the hardware portion based on the data records to provide communication between the simulation device and the hardware portion of the device to be tested, according to which driver the device to be tested is activated via the one or more test interfaces.

11. The test arrangement according to claim 10, wherein the data records also include elements describing attributes of a component.

12. The test arrangement according to claim 11, wherein the at least one computer unit further includes a checking device for checking the data records for consistency.

13. The test arrangement according to claim 12, wherein the system description device and/or the simulation device is designed to carry out the linking of the data records and the generating of the system description and/or the generation of the simulation without using elements describing attributes of the components and relationships of the components that are not consistent.

14. The test arrangement according to claim 10, wherein the at least one computer unit further includes a checking device for checking elements of the data records describing relationships of the components for consistency.

15. The test arrangement according to claim 14, wherein the system description device and/or the simulation device is designed to carry out the linking of the data records and generating of the system description and/or the generation of the simulation without using relationships of the components with one another that are not consistent.

16. The test arrangement according to claim 14, wherein the checking device is adapted to establish a match of signals, which according to a data record assigned to a first component are adapted to be received by the first component from a second component, with signals, which according to a data record assigned to the second component are adapted to be sent by the second component to the first component.

17. The test arrangement according to claim 10, wherein the at least one computer unit adapted to be connected via a connection device to a database containing the data records.

* * * * *